United States Patent
Wu et al.

(10) Patent No.: US 8,483,342 B2
(45) Date of Patent: Jul. 9, 2013

(54) DOWN SAMPLING METHOD AND DOWN SAMPLING DEVICE

(75) Inventors: Gengshi Wu, Shanghai (CN); Jing Yang, Shanghai (CN); Nian Peng, Shanghai (CN); Jiajing Zhou, Shanghai (CN); Shufan Huang, Shanghai (CN); Congli Mao, Shanghai (CN)

(73) Assignee: Huawei Device Co., Ltd., Shenzhen (CN)

( * ) Notice: Subject to any disclaimer, the term of this patent is extended or adjusted under 35 U.S.C. 154(b) by 0 days.

(21) Appl. No.: 13/368,801

(22) Filed: Feb. 8, 2012

(65) Prior Publication Data

US 2012/0142302 A1 Jun. 7, 2012

Related U.S. Application Data

(63) Continuation of application No. PCT/CN2010/071905, filed on Apr. 20, 2010.

(30) Foreign Application Priority Data

Aug. 10, 2009 (CN) .......................... 2009 1 0162711

(51) Int. Cl.
*H04L 7/00* (2006.01)
(52) U.S. Cl.
USPC ........................................................ 375/355
(58) Field of Classification Search
USPC ................................................. 375/355, 365
See application file for complete search history.

(56) References Cited

U.S. PATENT DOCUMENTS

| 5,228,057 A | 7/1993 | Larsson |
| 5,748,036 A | 5/1998 | Lee et al. |
| 5,835,541 A * | 11/1998 | Namekata et al. ............. 375/355 |
| 6,674,822 B1 * | 1/2004 | Legrand et al. ................ 375/355 |
| 2006/0006233 A1 | 1/2006 | Chang et al. |
| 2007/0110200 A1 | 5/2007 | Mergen et al. |

FOREIGN PATENT DOCUMENTS

| CN | 101299657 A | 11/2008 |
| CN | 101312529 A | 11/2008 |
| CN | 101369821 A | 2/2009 |
| CN | 101615996 A | 12/2009 |
| JP | 2006295913 A | 10/2006 |
| WO | 2008145039 A1 | 12/2008 |

OTHER PUBLICATIONS

Extended Search Report from the European Patent Office in Application No. EP 10 80 7878 dated Apr. 19, 2012.
Foreign Communications From a Counterpart Application, PCT Application PCT/CN2012/071905, English Translation of Written Opinion dated Jul. 15, 2010, 6 pages.
International Search Report from the Chinese Patent Office in International Application No. PCT/CN2010/071905 mailed Jul. 15, 2010.
First Chinese Office Action of Chinese Application No. 200910162711.8 mailed Mar. 24, 2011.
Second Chinese Office Action of Chinese Application No. 200910162711.8 mailed Nov. 10, 2011.

* cited by examiner

*Primary Examiner* — Jaison Joseph
(74) *Attorney, Agent, or Firm* — Conley Rose, P.C.; Grant Rodolph; Nicholas K. Beaulieu

(57) ABSTRACT

In the field of communications technologies, a down sampling method and a down sampling device are provided, to enable the energy of a down sampling point obtained in down sampling to be as large as possible. The down sampling method includes: extracting energy statistical values of sampling point sets in a current period; selecting a sampling position corresponding to a sampling point set with the largest energy statistical value as a down sampling position; and performing down sampling according to the down sampling position.

16 Claims, 10 Drawing Sheets

DOWN SAMPLING METHOD AND DOWN SAMPLING DEVICE

CROSS-REFERENCE TO RELATED APPLICATIONS

This application is a continuation of International Application No. PCT/CN2010/071905, filed on Apr. 20, 2010, which claims priority to Chinese Patent Application No. 200910162711.8, filed on Aug. 10, 2009, both of which are hereby incorporated by reference in their entireties.

FIELD OF THE INVENTION

The present invention relates to the field of communications technologies, and in particular, to a down sampling method and a down sampling device.

BACKGROUND OF THE INVENTION

Signals transmitted by communication systems can be classified into two main types: analog signals and digital signals. In certain cases, signals that can be processed by a communication transmitter and a communication receiver are digital signals, but a transmission medium can only transmit analog signals, and accordingly, digital/analog and analog/digital conversion is required in signal transmission. In data transmission, the communication transmitter converts a digital signal into a corresponding analog signal first, which is referred to as "modulation". When the modulated analog signal is transmitted to the communication receiver, the analog signal further needs to be sampled, quantized, and encoded, so as to be restored to the digital signal, which is referred to as "demodulation".

Sampling is an important process for signal demodulation. A sampling result may be measured by sampling rate, which defines the number of samples extracted per second from a continuous signal to form a discrete signal. The higher the sampling rate, the higher the Signal to Noise Ratio (SNR) of the sampled signal, and the higher the fidelity of the analog signal being restored to the digital signal. Therefore, in practical use, a generally used sampling rate is a symbol rate of multirate. The symbol rate represents a rate for transmitting a basic symbol of information, and the symbol is an expression of the information.

As the complexity is high when the sampled signal is demodulated at a symbol rate of multirate, down sampling of the signal is required, so as to enable the signal to be demodulated at a symbol rate of low data rate, in which the low data rate may be a single data rate or a double data rate.

In down sampling at a symbol rate of multirate, each symbol has a sampling sequence, and each sampling sequence includes multiple sampling points. Taking a quad data rate as an example, as shown in FIG. 1, the analog signal includes four symbols, and as shown in FIG. 2, each symbol is corresponding to a sampling sequence formed of four sampling points, in which the sampling sequences are {0, 1, 2, 3}, {4, 5, 6, 7}, {8, 9, 10, 11}, and {12, 13, 14, 15} respectively.

Down sampling is to extract one sampling point or one set of sampling points from a sampling sequence corresponding to each symbol, in which the set of sampling points include two or more sampling points. As shown in FIG. 3, when one sampling point needs to be extracted from each sampling sequence, an existing down sampling method is to extract a sampling point at a fixed position of each sampling sequence, for example, extract a sampling point at a first position, and then the sampling point corresponding to each symbol after down sampling is respectively {0}, {4}, {8}, and {12}, which are down sampling points.

The sampling sequences have different sampling points which have different energy, and the larger the energy, the more beneficial to the subsequent signal processing. However, the existing down sampling method is to extract the down sampling point at a fixed position of each sampling sequence, so it cannot be ensured that the energy of the down sampling point extracted in down sampling is the largest.

SUMMARY OF THE INVENTION

The technical problem to be solved in an embodiment of the present invention is to provide a down sampling method, so as to enable the energy of a down sampling point extracted in down sampling to be as large as possible.

In order to solve the technical problem, an embodiment of the present invention employs the following technical solution.

A down sampling method is provided, where the method includes:

extracting energy statistical values of sampling point sets in a current period;

selecting a sampling position corresponding to a sampling point set with the largest energy statistical value as a down sampling position; and performing down sampling according to the down sampling position.

In the down sampling method according to the embodiment of the present invention, since the sampling position corresponding to the sampling point set with the largest energy statistical value is selected as the down sampling position, and down sampling is performed according to the down sampling position to extract a down sampling point, the energy of the down sampling point extracted in down sampling is as large as possible, as compared with the method for extracting the down sampling point at a fixed sampling position of each sample point sequence in the prior art.

Another technical problem to be solved in an embodiment of the present invention is further directed to a down sampling device, so as to enable the energy of a down sampling point extracted in down sampling to be as large as possible.

In order to solve the technical problem, an embodiment of the present invention employs the following technical solution.

A down sampling device is provided, where the device includes:

an extraction unit, configured to extract energy statistical values of sampling point sets in a current period;

a selection unit, configured to select a sampling position corresponding to a sampling point set with the largest energy statistical value as a down sampling position; and a down sampling unit, configured to perform down sampling according to the down sampling position.

In the down sampling device according to the embodiment of the present invention, since the sampling position corresponding to the sampling point set with the largest energy statistical value is selected as the down sampling position by the selection unit, and down sampling is performed according to the down sampling position by the down sampling unit to extract a down sampling point, the energy of the down sampling point extracted in down sampling is as large as possible, as compared with the extraction of the down sampling point at a fixed sampling position of each sample point sequence in the prior art.

DETAILED DESCRIPTION OF THE EMBODIMENTS

Embodiments of the present invention intend to provide a down sampling method and a down sampling device, so as to enable the energy of a down sampling point extracted in down sampling to be as large as possible.

Figure 1:
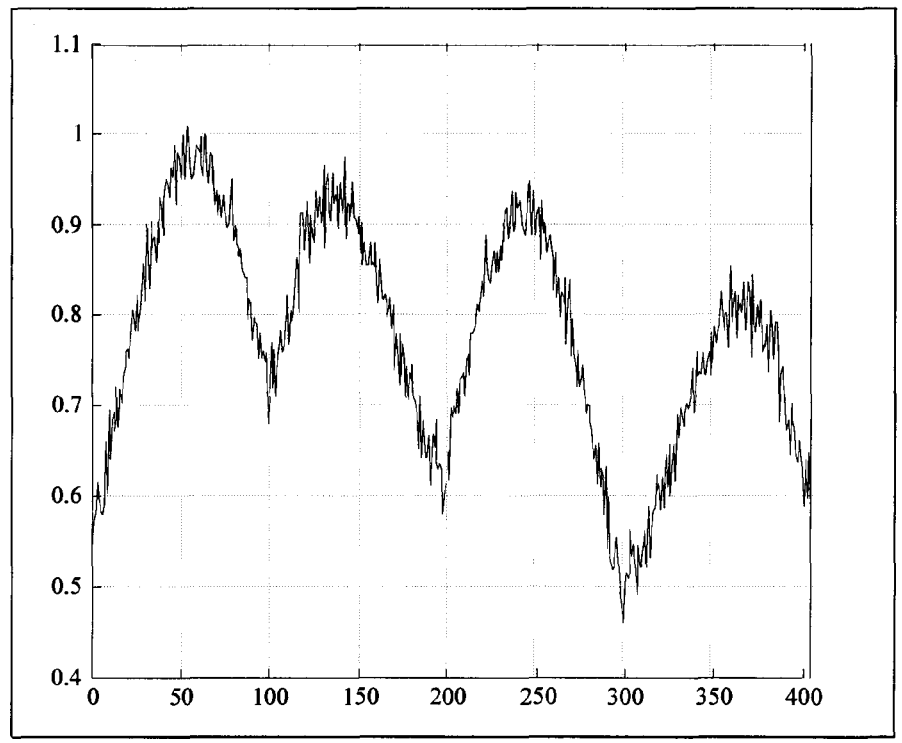
FIG. 1 shows an analog signal including four symbols in the prior art.
Figure 2:
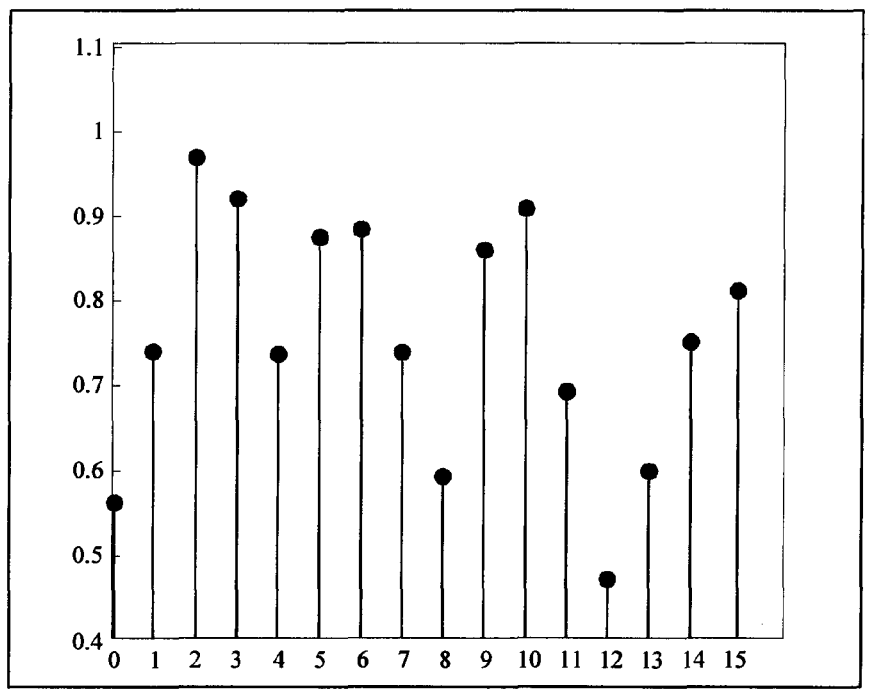
FIG. 2 shows sampling sequences of the analog signal as shown in FIG. 1 after sampling.
Figure 3:
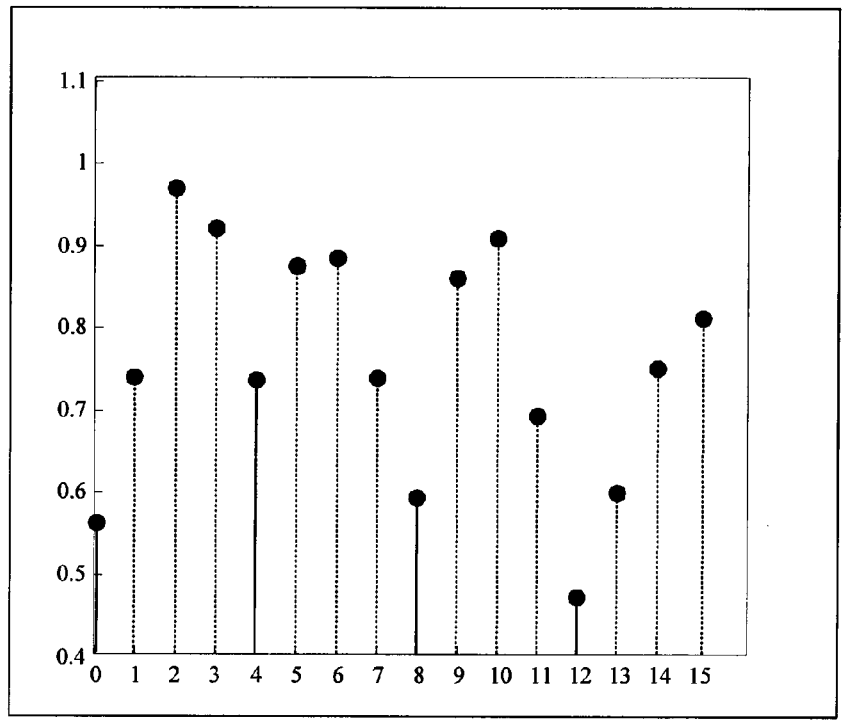
FIG. 3 shows a down sampling result obtained by performing down sampling on the sampling sequences as shown in FIG. 2 using a down sampling method in the prior art.
Figure 4:
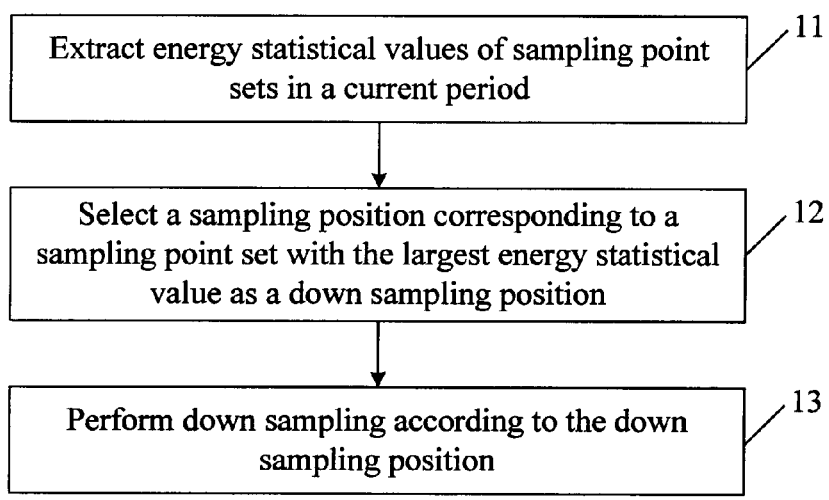
FIG. 4 is a flow chart of a down sampling method according to an embodiment of the present invention.

As shown in FIG. 4, a down sampling method according to an embodiment of the present invention includes the following steps.

Step 11: Extract energy statistical values of sampling point sets in a current period.

Step 12: Select a sampling position corresponding to a sampling point set with the largest energy statistical value as a down sampling position.

Step 13: Perform down sampling according to the down sampling position.

In the down sampling method, since the sampling position corresponding to the sampling point set with the largest energy statistical value is selected as the down sampling position, and down sampling is performed according to the down sampling position to extract a down sampling point, the energy of the down sampling point extracted in down sampling is as large as possible, as compared with the method for extracting the down sampling point at a fixed sampling position of each sample point sequence in the prior art.

Figure 5:
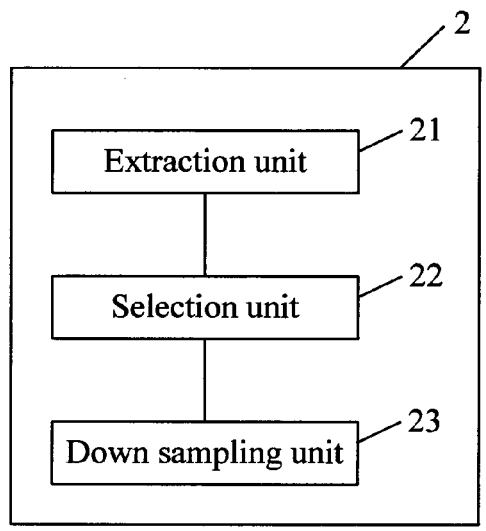
FIG. 5 is a schematic system constitutional diagram of a down sampling device according to an embodiment of the present invention.

As shown in FIG. 5, a down sampling device 2 according to an embodiment of the present invention includes an extraction unit 21, a selection unit 22, and a down sampling unit 23.

The extraction unit 21 is configured to extract energy statistical values of sampling point sets in a current period.

The selection unit 22 is configured to select a sampling position corresponding to a sampling point set with the largest energy statistical value as a down sampling position.

The down sampling unit 23 is configured to perform down sampling according to the down sampling position.

In the down sampling device, since the sampling position corresponding to the sampling point set with the largest energy statistical value is selected as the down sampling position by the selection unit, and down sampling is performed according to the down sampling position by the down sampling unit to extract a down sampling point, the energy of the down sampling point extracted in down sampling is as large as possible, as compared with the extraction of the down sampling point at a fixed sampling position of each sample point sequence in the prior art.

As known to persons of ordinary skill in the art, the energy values and energy statistical values do not just refer to absolute magnitudes of the energy, and can also be various relative values capable of reflecting relative magnitudes of the energy and transformed values, for example, values obtained after the absolute values of the energy are multiplied by a non-zero number.

The embodiments of the present invention are described in detail below with reference to the accompanying drawings.

Embodiment 1

Figure 6:
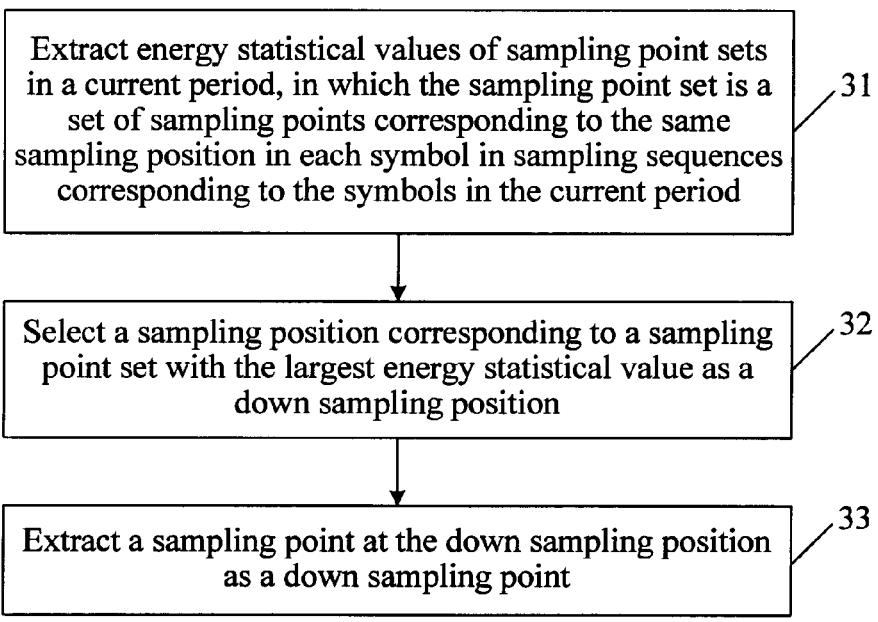
FIG. 6 is a flow chart of a down sampling method according to Embodiment 1 of the present invention.

As shown in FIG. 6, a down sampling method according to Embodiment 1 of the present invention includes the following steps.

Step 31: Extract energy statistical values of sampling point sets in a current period, in which the sampling point set is a set of sampling points corresponding to the same sampling position in each symbol in sampling sequences corresponding to the symbols in the current period.

Figure 7:
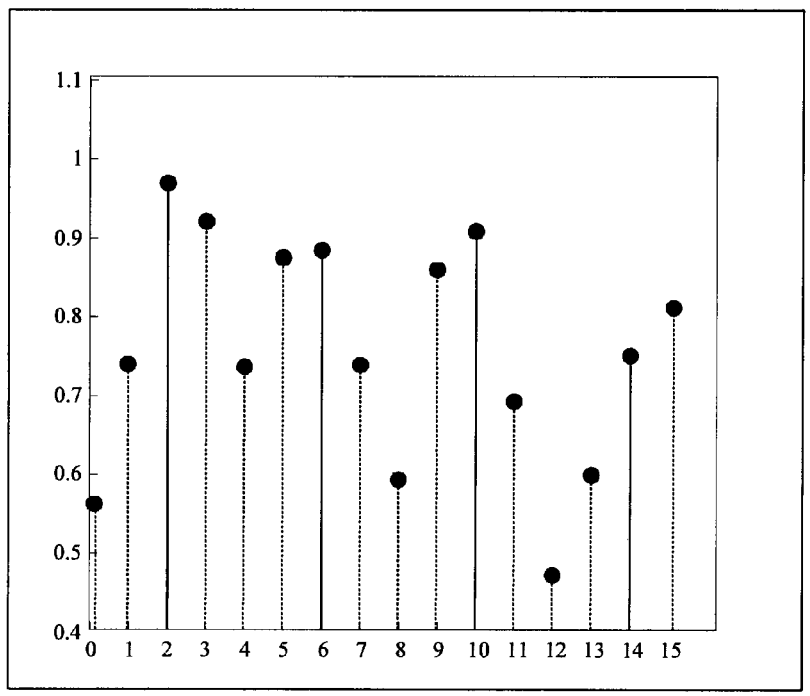
FIG. 7 shows a down sampling result obtained by performing down sampling on the sampling sequences as shown in FIG. 2 using the down sampling method according to Embodiment 1 of the present invention.

As shown in FIG. 7, taking an analog signal including four symbols in a period as an example, the sampling sequences corresponding to the symbols in the current period are respectively $\{0, 1, 2, 3\}$, $\{4, 5, 6, 7\}$, $\{8, 9, 10, 11\}$, and $\{12, 13, 14, 15\}$. A sampling point set corresponding to a first sampling position in each symbol is $\{0, 4, 8, 12\}$, and similarly, sampling point sets corresponding to a second, a third, and a fourth sampling position are respectively $\{1, 5, 9, 13\}$, $\{2, 6, 10, 14\}$, and $\{3, 7, 11, 15\}$. The extracting the energy statistical values of the sampling point sets in the current period refers to extracting energy statistical values of sampling point sets $\{0, 4, 8, 12\}$, $\{1, 5, 9, 13\}$, $\{2, 6, 10, 14\}$, and $\{3, 7, 11, 15\}$.

Figure 8:
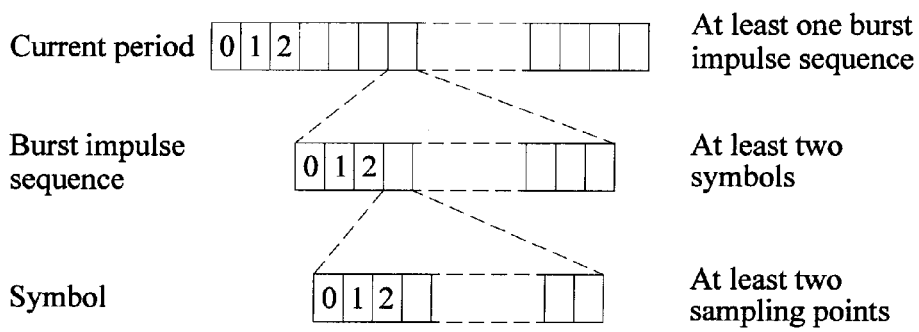
FIG. 8 is a schematic structure diagram of an analog signal according to an embodiment of the present invention.

As shown in FIG. 8, the current period includes at least one burst impulse sequence each including at least two symbols, and at least two sampling points are extracted from each symbol; as a result, the extracting the energy statistical values of the sampling point sets in the current period may specifically include the following two steps.

Step 311: Extract energy statistical values of sampling point sets in each burst impulse sequence.

Step 312: Accumulate the energy statistical values of the sampling point sets in each burst impulse sequence, so as to obtain the energy statistical values of the sampling point sets in the current period.

Specifically, the energy statistical value may be a sum of energy of the sampling points included in the sampling point set, or an average of energy of the sampling points included in the sampling point set.

Step 32: Select a sampling position corresponding to a sampling point set with the largest energy statistical value as a down sampling position. It is assumed that the energy statistical value is a sum of energy of the sampling points included in the sampling point set. It can be seen from FIG. 7 that, the energy statistical value of the sampling point set {2, 6, 10, 14} corresponding to the third sampling position is the largest, so the third sampling position is selected as the down sampling position.

Step 33: Extract a sampling point at the down sampling position as a down sampling point. In this embodiment, a sampling point is extracted at the third sampling position as the down sampling point by specifically the following two methods.

In the first method, down sampling is performed on each symbol in the current period according to the selected down sampling position in the current period.

In the second method, down sampling is performed on each symbol in a next period according to the selected down sampling position in the current period.

In order to reduce the cost of storage and time delay in the current period, the second method may be adopted.

Embodiment 2

Figure 9:
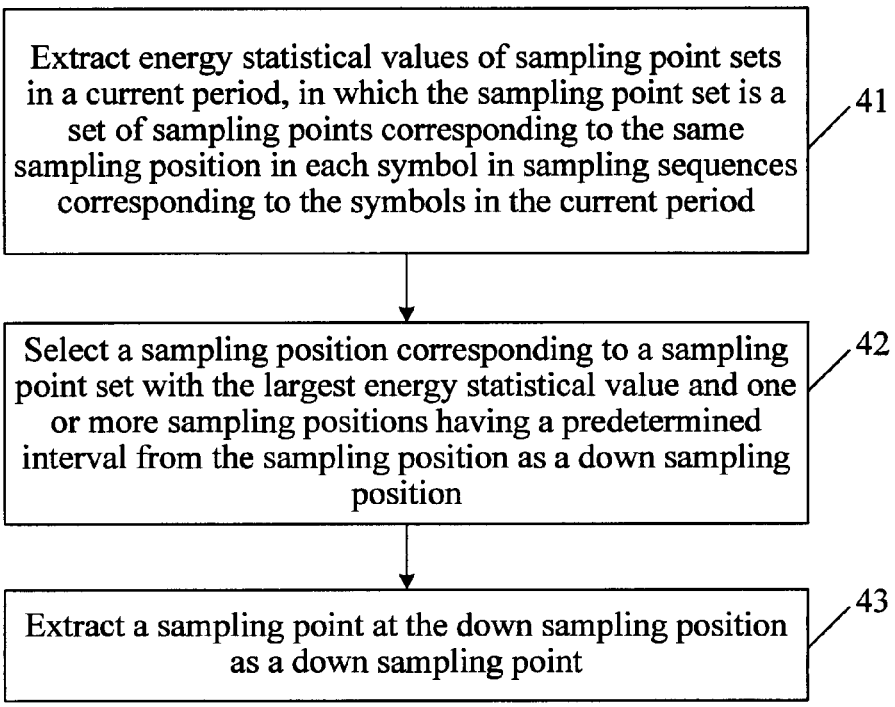
FIG. 9 is a flow chart of a down sampling method according to Embodiment 2 of the present invention.

As shown in FIG. 9, a down sampling method according to Embodiment 2 of the present invention includes the following steps.

Step 41: Extract energy statistical values of sampling point sets in a current period, in which the sampling point set is a set of sampling points corresponding to the same sampling position in each symbol in sampling sequences corresponding to the symbols in the current period.

Figure 10:
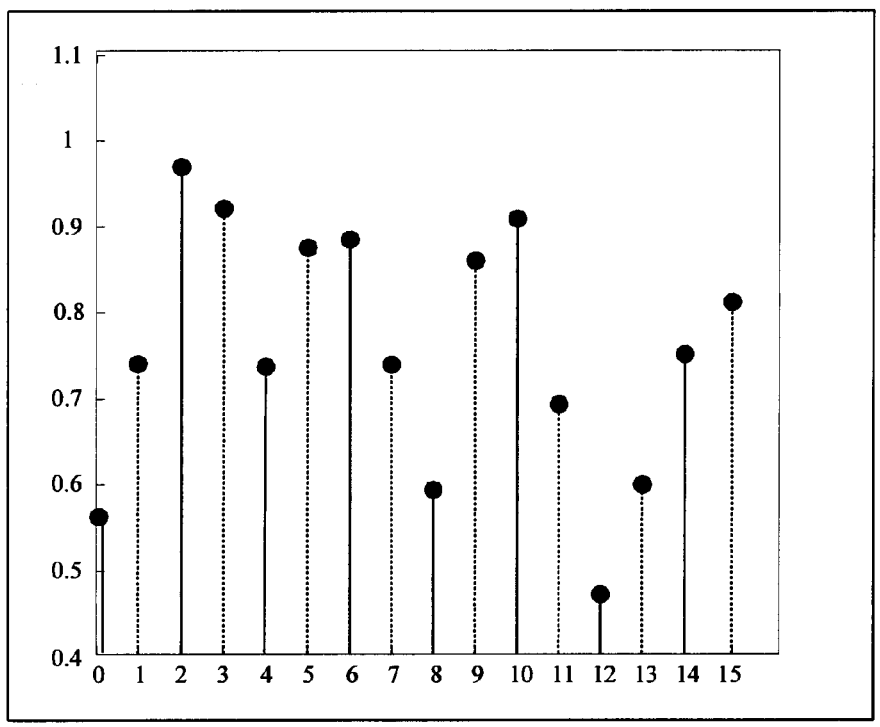
FIG. 10 shows a down sampling result obtained by performing down sampling on the sampling sequences as shown in FIG. 2 using the down sampling method according to Embodiment 2 of the present invention.

As shown in FIG. 10, taking an analog signal including four symbols in a period as an example, a sampling point set corresponding to a first sampling position in each symbol is {0, 4, 8, 12}, and similarly, sampling point sets corresponding to a second, a third, and a fourth sampling position are respectively {1, 5, 9, 13}, {2, 6, 10, 14}, and {3, 7, 11, 15}.

Similar to Embodiment 1, the current period includes at least one burst impulse sequence each including at least two symbols, and at least two sampling points are extracted from each symbol. Therefore, the extracting the energy statistical values of the sampling point sets in the current period in Embodiment 2 also specifically includes the following two steps.

Step 411: Extract energy statistical values of sampling point sets in each burst impulse sequence.

Step 412: Accumulate the energy statistical values of the sampling point sets in each burst impulse sequence, so as to obtain the energy statistical values of the sampling point sets in the current period.

In addition, the energy statistical value may be a sum of energy of the sampling points included in the sampling point set, or an average of energy of the sampling points included in the sampling point set.

Step 42: Select a sampling position corresponding to a sampling point set with the largest energy statistical value and one or more sampling positions having a predetermined interval from the sampling position as the down sampling position.

In this embodiment, it is assumed that the energy statistical value is a sum of energy of the sampling points included in the sampling point set. It can be seen from FIG. 10 that, the energy statistical value of the sampling point set {2, 6, 10, 14} corresponding to the third sampling position is the largest, so the third sampling position is selected as the down sampling position.

In addition, the down sampling position further includes one or more sampling positions having a predetermined interval from the third sampling position. An integer value such as 0, 1, and 2 is taken for the predetermined interval. In this embodiment, 1 is taken for the predetermined interval, and accordingly, the down sampling position further includes the first sampling position. Therefore, as shown in FIG. 10, the finally selected down sampling positions are the first sampling position and the third sampling position.

Step 43: Extract a sampling point at the down sampling position as a down sampling point. In this embodiment, sampling points are extracted at the first sampling position and the third sampling position as the down sampling points. Similar to Embodiment 1, the down sampling point is also extracted by the following two methods in this embodiment.

In the first method, down sampling is performed on each symbol in the current period according to the selected down sampling position in the current period.

In the second method, down sampling is performed on each symbol in a next period according to the selected down sampling position in the current period.

Likewise, in order to reduce the cost of storage and time delay in the current period, the second method may be adopted.

Embodiment 3

Figure 11:
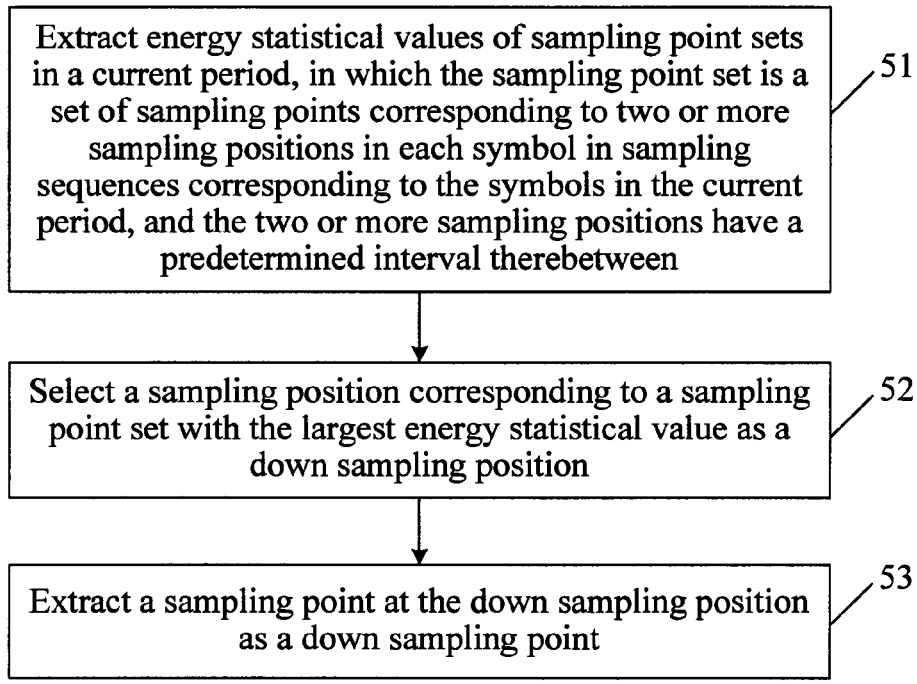
FIG. 11 is a flow chart of a down sampling method according to Embodiment 3 of the present invention.

As shown in FIG. 11, a down sampling method according to Embodiment 3 of the present invention includes the following steps.

Step 51: Extract energy statistical values of sampling point sets in a current period, in which the sampling point set is a set of sampling points corresponding to two or more sampling positions in each symbol in sampling sequences corresponding to the symbols in the current period, and the two or more sampling positions have a predetermined interval therebetween.

Figure 12:
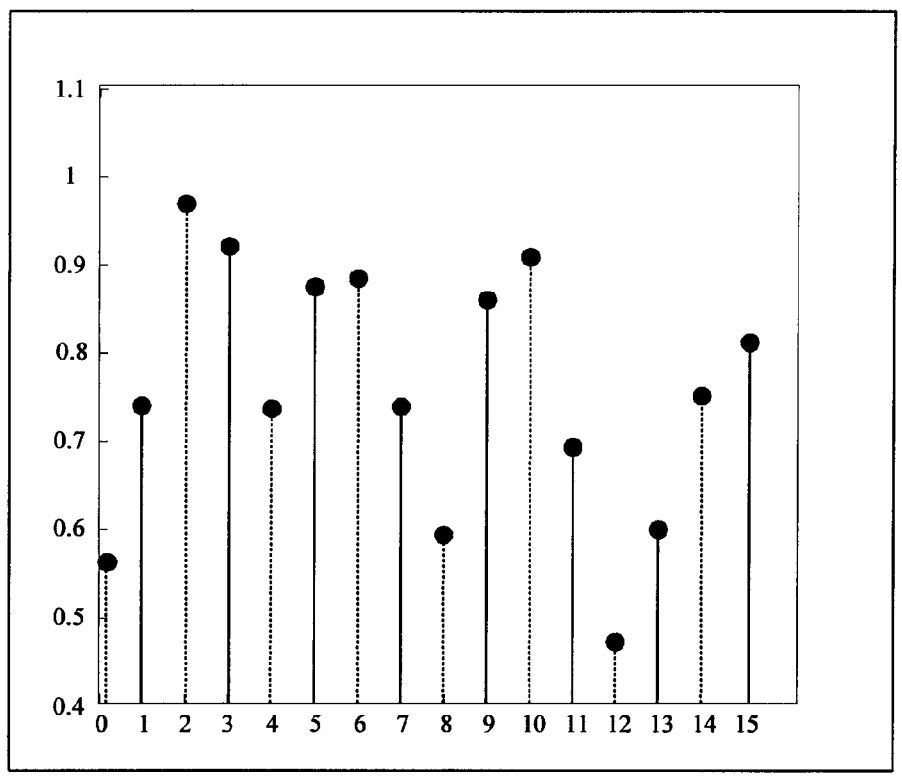
FIG. 12 shows a down sampling result obtained by performing down sampling on the sampling sequences as shown in FIG. 2 using the down sampling method according to Embodiment 3 of the present invention.

An integer value such as 0, 1, and 2 is taken for the predetermined interval. In this embodiment, 1 is taken for the predetermined interval. As shown in FIG. 12, taking an analog signal including four symbols in a period as an example, a sampling point set corresponding to a first and a third sampling position in each symbol is {{0, 4, 8, 12}, {2, 6, 10, 14}}, and similarly, a sampling point set corresponding to a second and a fourth sampling position is {{1, 5, 9, 13}, {3, 7, 11, 15}}.

Similar to Embodiment 1 and Embodiment 2, the current period includes at least one burst impulse sequence each including at least two symbols, and at least two sampling points are extracted from each symbol. Therefore, the extracting the energy statistical values of the two sampling point sets in the current period in Embodiment 3 specifically includes the following two steps.

Step 511: Extract energy statistical values of sampling point sets in each burst impulse sequence.

Step 512: Accumulate the energy statistical values of the sampling point sets in each burst impulse sequence, so as to obtain the energy statistical values of the sampling point sets in the current period.

In addition, the energy statistical value may be a sum of energy of the sampling points included in the sampling point set, or an average of energy of the sampling points included in the sampling point set.

Step 52: Select a sampling position corresponding to a sampling point set with the largest energy statistical value as the down sampling position.

In this embodiment, it is assumed that the energy statistical value is a sum of energy of the sampling points included in the sampling point set. It can be seen from FIG. 12 that, the energy statistical value of the sampling point set {{1, 5, 9, 13}, {3, 7, 11, 15}} corresponding to the second and the fourth sampling positions is the largest, so the second sampling position and the fourth sampling position are selected as the down sampling position.

Step 53: Extract a sampling point at the down sampling position as a down sampling point. In this embodiment, the sampling points are extracted at the second sampling position and the fourth sampling position as the down sampling points. Similar to Embodiment 1 and Embodiment 2, the down sampling point is also extracted by the following two methods in this embodiment.

In the first method, down sampling is performed on each symbol in the current period according to the selected down sampling position in the current period.

In the second method, down sampling is performed on each symbol in a next period according to the selected down sampling position in the current period.

Likewise, in order to reduce the cost of storage and time delay in the current period, the second method may be adopted.

Embodiment 4

Figure 13:
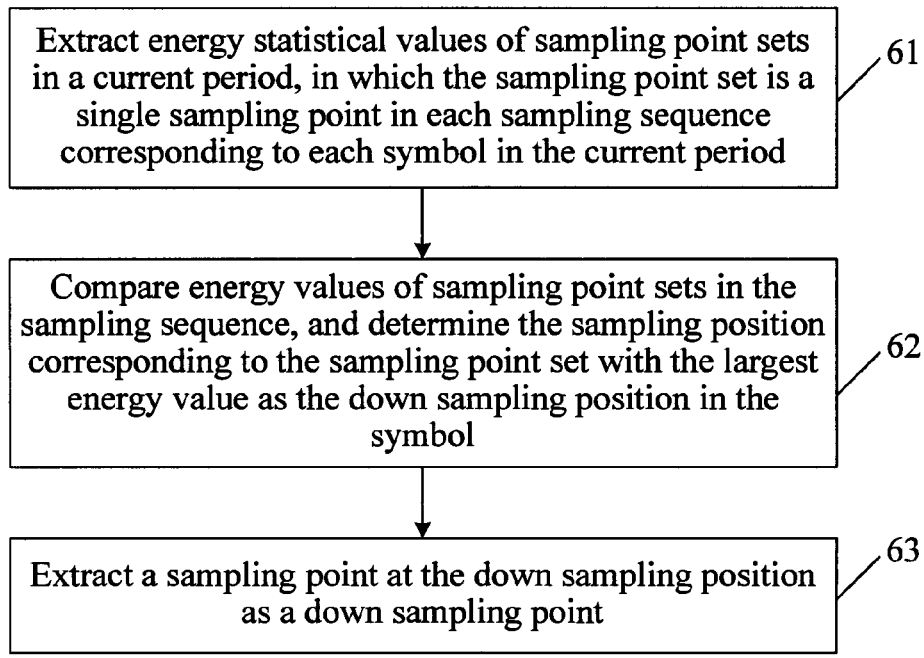
FIG. 13 is a flow chart of a down sampling method according to Embodiment 4 of the present invention.

As shown in FIG. 13, a down sampling method according to Embodiment 4 of the present invention includes the following steps.

Step 61: Extract energy statistical values of sampling point sets in a current period, in which the sampling point set is a single sampling point in each sampling sequence corresponding to each symbol in the current period.

Figure 14:
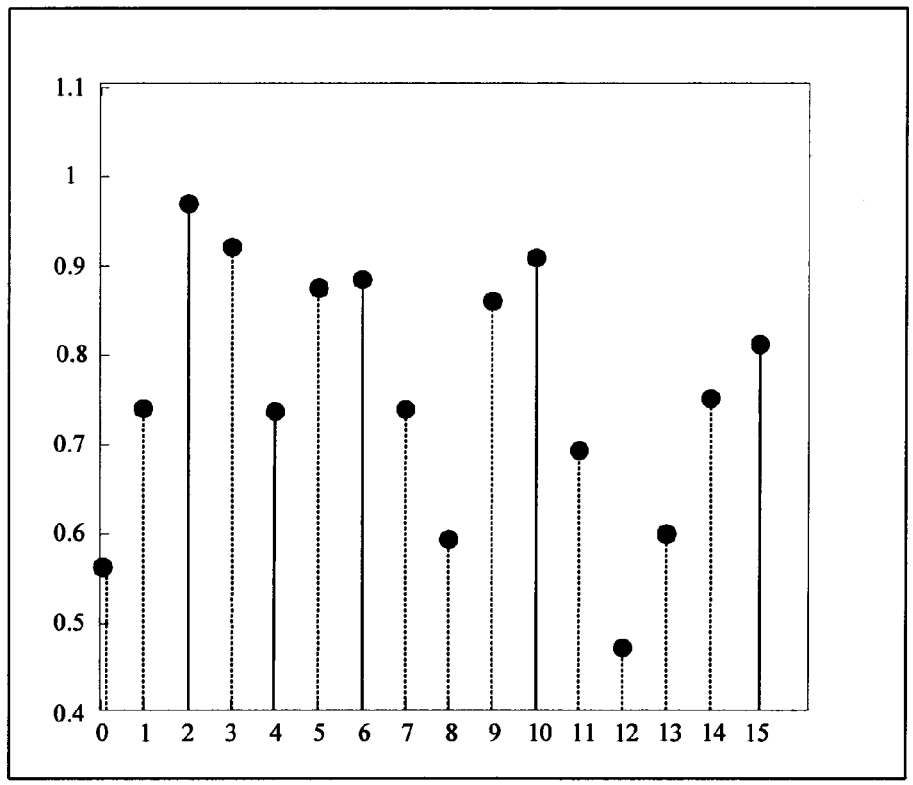
FIG. 14 shows a down sampling result obtained by performing down sampling on the sampling sequences as shown in FIG. 2 using the down sampling method according to Embodiment 4 of the present invention.

As shown in FIG. 14, taking an analog signal including four symbols in a period as an example, the sampling sequences corresponding to each symbol are respectively {0, 1, 2, 3}, {4, 5, 6, 7}, {8, 9, 10, 11}, and {12, 13, 14, 15}. Therefore, the sampling point sets in the first sampling sequence {0, 1, 2, 3} are respectively {0}, {1}, {2}, and {3}, and similarly, the sampling point sets in the rest sampling sequences may be deduced by analogy.

Step 62: Select a sampling position corresponding to a sampling point set with the largest energy statistical value as the down sampling position. As in this embodiment, the current period includes at least one symbol, and one symbol is corresponding to one sampling sequence, the step of selecting the down sampling position is specifically comparing energy values of sampling point sets in the sampling sequence, and determining the sampling position corresponding to the sampling point set with the largest energy value as the down sampling position in the symbol. The down sampling positions of the rest symbols are also determined according to this method.

It can be seen from FIG. 14 that, the energy value of the sampling point set {2} in the first sampling sequence {0, 1, 2, 3} is the largest, the energy value of the sampling point set {6} in the second sampling sequence {4, 5, 6, 7} is the largest, the energy value of the sampling point set {10} in the third sampling sequence {8, 9, 10, 11} is the largest, and the energy value of the sampling point set {15} in the fourth sampling sequence {12, 13, 14, 15} is the largest, and therefore, the sampling positions corresponding to the sampling point sets {2}, {6}, {10}, and {15} are determined as the down sampling positions.

Step 63: Extract a sampling point at the down sampling position as a down sampling point. In this embodiment, the sampling points are extracted at the sampling positions corresponding to the sampling point sets {2}, {6}, {10}, and {15} as the down sampling points. Similar to Embodiment 1, Embodiment 2, and Embodiment 3, the down sampling points are also extracted by the following two methods in this embodiment.

In the first method, down sampling is performed on each symbol in the current period according to the selected down sampling position in the current period.

In the second method, down sampling is performed on each symbol in a next period according to the selected down sampling position in the current period.

Likewise, in order to reduce the cost of storage and time delay in the current period, the second method may be adopted.

To sum up, in the down sampling method according to the foregoing four embodiments, since the sampling position corresponding to the sampling point set with the largest energy statistical value is selected as the down sampling position, and down sampling is performed according to the down sampling position, so as to extract the down sampling point, the energy of the down sampling point extracted in down sampling is as large as possible, as compared with the method for extracting the down sampling point at a fixed sampling position of each sample point sequence in the prior art.

Persons of ordinary skill in the art should understand that all or a part of the processes of the method according to the embodiments of the present invention may be implemented by a computer program instructing relevant hardware. The program may be stored in a computer readable storage medium. When the program is run, the processes of the method according to the embodiments of the present invention are performed. The storage medium may be a magnetic disk, an optical disk, a Read-Only Memory (ROM), or a Random Access Memory (RAM).

Embodiment 5

Figure 15:
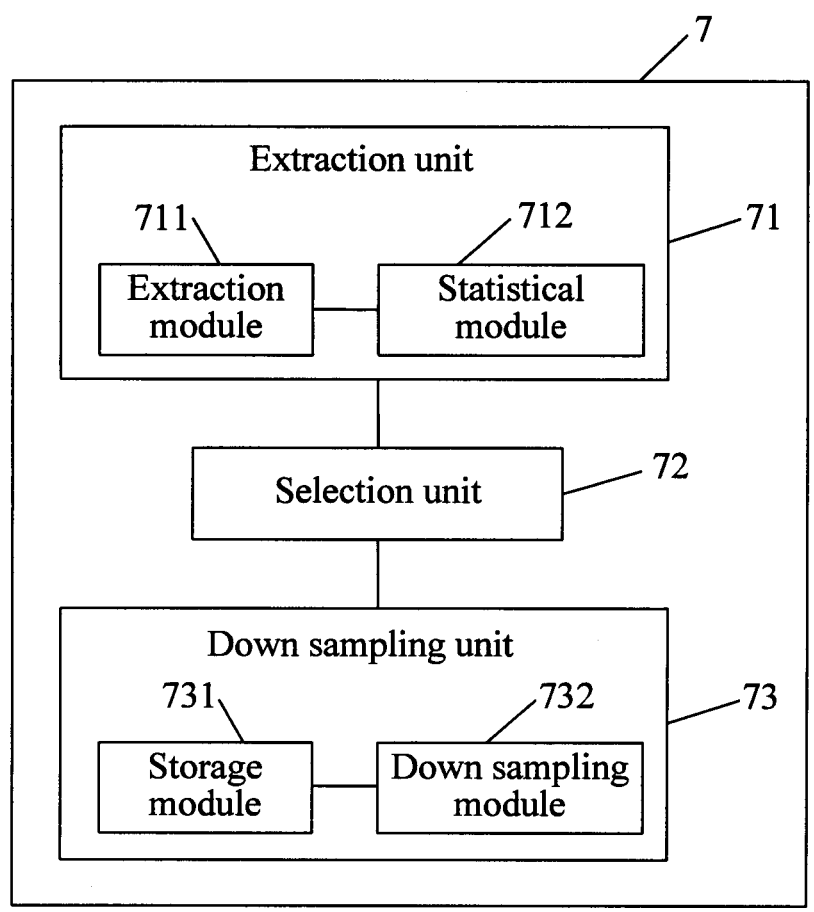
FIG. 15 is a schematic system constitutional diagram of a down sampling device according to Embodiment 5 of the present invention.

As shown in FIG. 15, Embodiment 5 of the present invention provides a down sampling device 7. The down sampling device is described below with reference to the down sampling method according to Embodiment 1 of the present invention. The down sampling device 7 includes an extraction unit 71.

The extraction unit 71 is configured to extract energy statistical values of sampling point sets in a current period, in which the sampling point set is a set of sampling points corresponding to the same sampling position in each symbol in sampling sequences corresponding to the symbols in the current period. The energy statistical value may be a sum of energy of the sampling points included in the sampling point set, or an average of energy of the sampling points included in the sampling point set.

In this embodiment, the current period includes at least one burst impulse sequence each including at least two symbols, and at least two sampling points are extracted from each symbol. Therefore, the extraction unit 71 specifically includes an extraction module 711 and a statistical module 712.

The extraction module 711 is configured to extract energy statistical values of sampling point sets in each burst impulse sequence.

The statistical module 712 is configured to accumulate the energy statistical values of the sampling point sets in each burst impulse sequence, so as to obtain the energy statistical values of the sampling point sets in the current period. The down sampling device 7 further includes a selection unit 72 and a down sampling unit 73.

The selection unit 72 is configured to select a sampling position corresponding to a sampling point set with the largest energy statistical value from the sampling point sets as a down sampling position.

The down sampling unit 73 is configured to extract a sampling point at the down sampling position as a down sampling point. In order to reduce the cost of storage and time delay in the current period, down sampling may be performed on each symbol in a next period according to the selected down sampling position in the current period. Therefore, the down sampling unit 73 specifically includes a storage module 731 and a down sampling module 732.

The storage module 731 is configured to store information of the down sampling position determined in the current period.

The down sampling module 732 is configured to perform down sampling on each symbol in the next period according to the information of the down sampling position.

In this embodiment, the device is only described to be applicable to the down sampling method according to Embodiment 1, but in other embodiments of the present invention, the device is also applicable to the down sampling method according to Embodiment 2 and Embodiment 3. The device is also applicable to the down sampling method according to Embodiment 4 through some modifications made by persons of ordinary skill in the art without creative efforts.

Embodiment 6

Embodiment 6 of the present invention provides specific hardware implementation of a down sampling device, in which the down sampling device reuses a part of the structure of an existing automatic gain control device, so as to avoid repetitive structural design and reduce hardware cost.

Hereinafter, description is still made with reference to the down sampling method according to Embodiment 1. In the down sampling method according to Embodiment 1, the current period includes at least one burst impulse sequence including at least two symbols, and it is assumed that each symbol is corresponding to a sampling sequence formed of four sampling points, that is, each symbol has four sampling positions.

Figure 16:
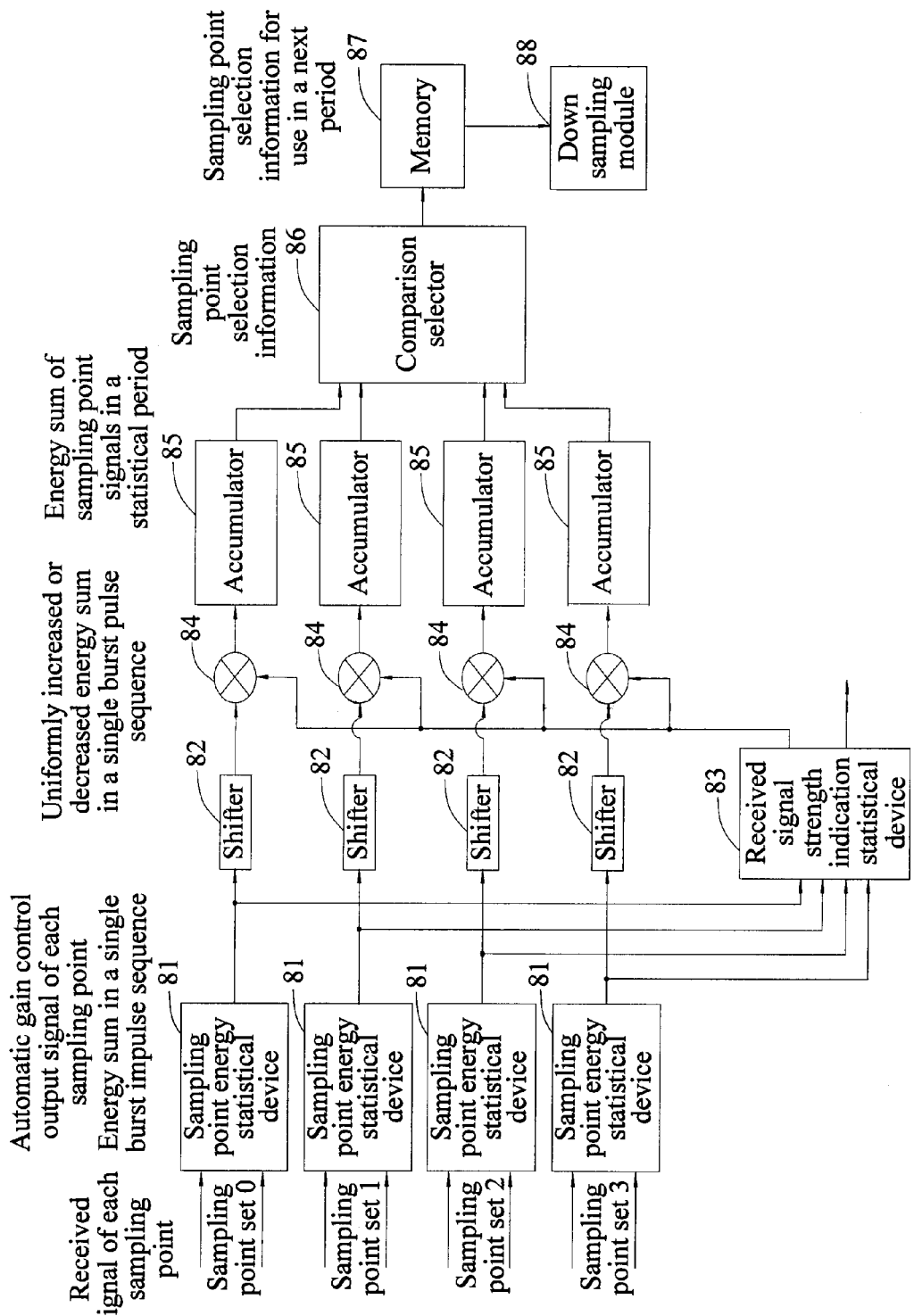
FIG. 16 is a schematic diagram of a down sampling device according to Embodiment 6 of the present invention.

As shown in FIG. 16, a sampling point set 0 represents a set of sampling points at a first sampling position of symbols in a period, and similarly, sampling point set 1, sampling point set 2, and sampling point set 3 respectively represent sets of sampling points at the second, the third, and the fourth sampling position. In the down sampling device according to this embodiment, the following steps are implemented.

First, energy values of the sampling points in the sampling point set 0, the sampling point set 1, the sampling point set 2, and the sampling point set 3 are respectively input to respective sampling point energy statistical devices 81, the sampling point energy statistical devices 81 take statistics of energy values of the sampling point in the sampling point sets to obtain energy statistical values of sampling point sets in one burst impulse sequence, and output the energy statistical values in two paths, in which one is output to shifters 82, and the other is output to a received signal strength indication statistical device 83.

The shifters 82 respectively shift the energy statistical values of the sampling point sets, so as to uniformly increase or decrease the energy statistical values. This is because in subsequent comparison of the energy statistical values of the sampling point sets, the energy statistical values need to be limited in a certain range due to the reason in hardware implementation such as resolution. In this way, the energy statistical values need to be shifted and decreased when they are too large, and shifted and increased when they are too small, but it is difficult to limit the increased or decreased energy statistical values exactly in the certain range. The received signal strength indication statistical device 83 further calculates adjustment factors according to the energy statistical values of the sampling point sets.

Then, the shifted energy statistical values and the adjustment factors are output to multipliers 84, for multiplying the shifted energy statistical values by the adjustment factors to obtain adjusted energy statistical values.

Afterwards, the adjusted energy statistical values are output to accumulators 85, and the accumulators 85 accumulate the adjusted energy statistical values in one period, so as to obtain the energy statistical values in the period.

Finally, the energy statistical values in the period are output to a comparison selector 86, and the comparison selector 86 selects a sampling point set with the largest energy statistical value in the period from the sampling point sets, and outputs position information of the sampling point set to a memory 87.

The memory 87 stores the position information for one period, so as to enable a down sampling device 88 to perform down sampling according to the position information in a next period.

The extraction unit 21 specifically includes the sampling point energy statistical devices 81, the shifters 82, the received signal strength indication statistical device 83, the multipliers 84, and the accumulators 85.

The selection unit 22 specifically includes the comparison selector 86.

The down sampling unit 23 includes the memory 87 and the down sampling module 88.

The sampling point energy statistical device 81 and the received signal strength indication statistical device 83 have been used in gain control, and are part of an existing automatic gain control device. In the existing automatic gain control device, the two modules operate to generate an increased or decreased coefficient of energy for gain control. In order to avoid repetitive structural design, the two modules are reused in this embodiment, thereby reducing hardware cost.

In this embodiment, the device is only described to be applicable to the down sampling method according to Embodiment 1, but in other embodiments of the present invention, the device is also applicable to the down sampling method according to Embodiment 2 and Embodiment 3. The device is also applicable to the down sampling method according to Embodiment 4 through some modifications made by persons of ordinary skill in the art without creative efforts.

Embodiment 7

Embodiment 7 of the present invention provides a specific down sampling device, by which not only down sampling points needed in signal demodulation but also down sampling points needed in synchronization position estimation and channel estimation can be obtained.

Figure 17:
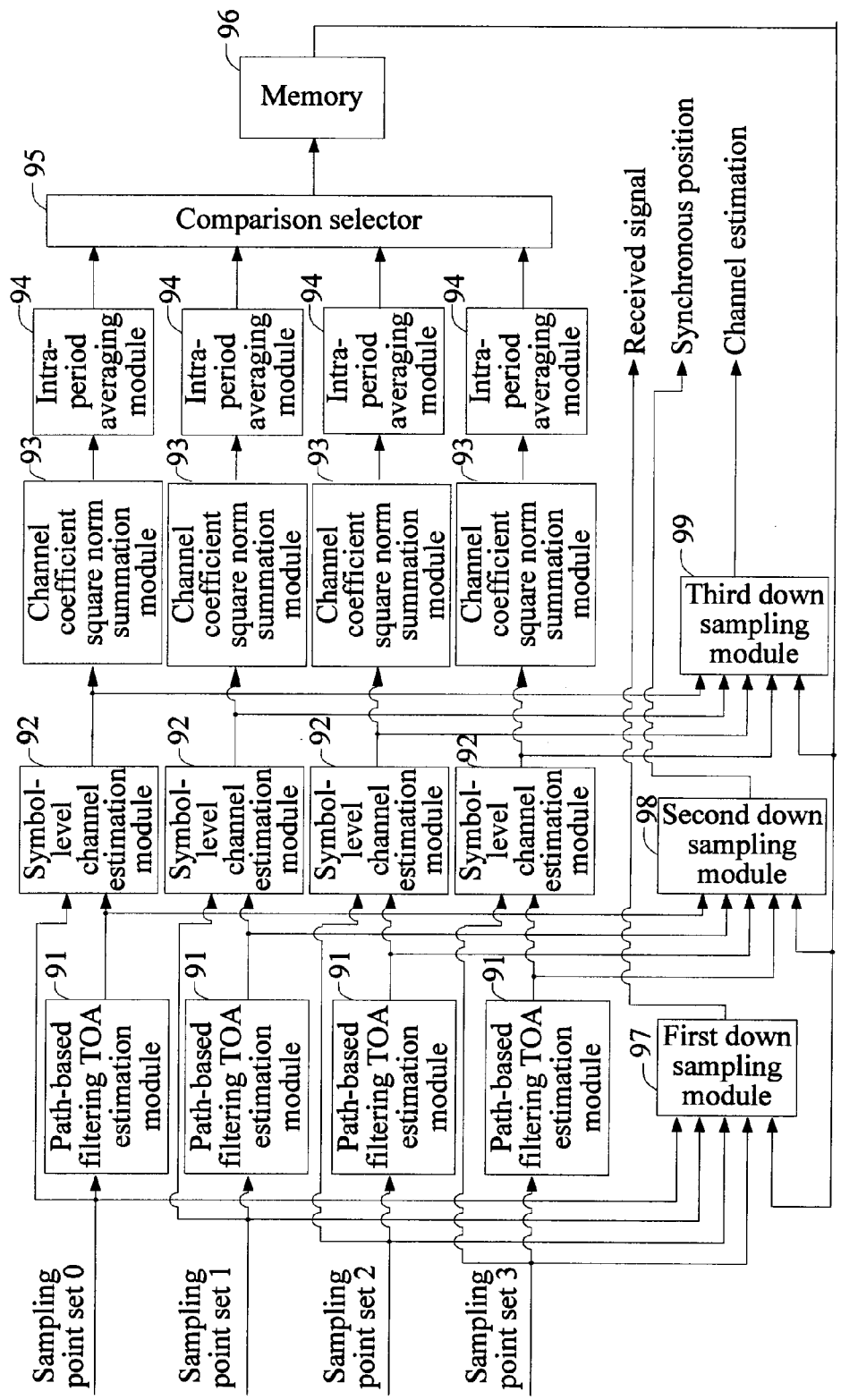
FIG. 17 is a schematic diagram of a down sampling device according to Embodiment 7 of the present invention.

In Embodiment 7, a current period includes at least one burst impulse sequence each including at least two symbols, and it is assumed that each symbol is corresponding to a sampling sequence formed of four sampling points, that is, each symbol has four sampling positions. As shown in FIG. 17, a sampling point set 0 represents a set of sampling points at a first sampling position of the symbols in a period, and similarly, sampling point set 1, sampling point set 2, and sampling point set 3 respectively represent sets of sampling points at a second, a third, and a fourth sampling position.

It can be known from FIG. 17 that, a down sampling result of a received signal, a down sampling result of a synchronization position, and a down sampling result of channel estimation can be respectively obtained by the down sampling device according to Embodiment 7.

The extraction unit 21 specifically includes path-based filtering Time of Arrival (TOA) estimation modules 91, symbol-level channel estimation modules 92, and channel coefficient square norm summation modules 93.

The selection unit 22 includes intra-period averaging modules 94 and a comparison selector 95.

The down sampling unit 23 specifically includes a memory 96, a first down sampling module 97, a second down sampling module 98, and a third down sampling module 99.

As shown in FIG. 17, a sampled sampling point energy value signal in the current period is split into three paths, one path of signal is input to the path-based filtering TOA estimation module 91, one path of signal is input to the symbol level channel estimation module 92, and the other path of signal is input to the first down sampling module 97. Implementation of this embodiment is described in detail below.

First, the path-based filtering TOA estimation module 91 calculates time differences of the input sampling point energy signal arriving at a terminal through channels according to the input sampling point energy signal, and calculates adjustment time according to the time differences, in which the adjustment time is split into two paths, one path of adjustment time is input to the symbol level channel estimation module 92, and the other path of adjustment time is input to the second down sampling module 98. This is because the same signal received by the terminal may be transmitted through multiple channels, and the lengths and performance of the channels are different, the signal arrives at the terminal earlier through one channel, and arrives at the terminal later through another channel, so that interference is generated in signal superposition, and accordingly, the adjustment time needs to be calculated for signal adjustment.

Then, the symbol level channel estimation module 92 simulates the channels according to the received sampling point energy signal and the adjustment time, and estimates channel coefficients of the channels, in which the channel coefficients are also split into two paths, one path of channel coefficients is input to the channel coefficient square norm summation module 93, and the other path of channel coefficients is input to the third down sampling module 99.

Then, the channel coefficient square norm summation module 93 provides an energy calculation manner. As a signal is transmitted through multiple channels, the channel coefficient square norm summation module 93 first takes a square norm of the channel coefficients of the channels, and then adds the channel coefficients whose square norm is taken to obtain a sum, so as to obtain channel coefficient statistical values of the channels. The magnitude of the channel coefficient statistical value can reflect the magnitude of the energy statistical value of each sampling point set, so the magnitudes of the energy statistical values of each sampling point sets can be obtained by comparing the magnitudes of the channel coefficient statistical values.

Subsequently, the intra-period averaging module 94 takes an average of the obtained channel coefficient statistical values in the period, so as to obtain an average value of energy statistical values in one burst impulse sequence, that is, an intra-period average energy statistical value, so that the energy statistical values are decreased and limited in a range resolvable by hardware of the comparison selector 95. For the purpose of achieving the objective of the present invention, this module is not essential.

Afterwards, the comparison selector 95 receives and compares intra-period average energy statistical values of the sampling point set 0, the sampling point set 1, the sampling point set 2, and the sampling point set 3 in one period, so as to determine a sampling position corresponding to a sampling point set with the largest intra-period average energy statistical value as a down sampling position.

Finally, the memory 96 stores information of the down sampling position for one statistical period, and feeds the information of the down sampling position back to the first down sampling module 97, the second down sampling module 98, and the third down sampling module 99 respectively in a next period.

The first down sampling module 97 performs down sampling on the input received signals of the sampling point set 0, the sampling point set 1, the sampling point set 2, and the sampling point set 3 according to the fed back information of the down sampling position, so as to obtain a down sampling result of the received signals.

The second down sampling module 98 performs down sampling on the adjustment time calculated respectively according to the sampling point set 0, the sampling point set 1, the sampling point set 2, and the sampling point set 3 according to the fed back information of the down sampling position, so as to obtain a down sampling result of a synchronization position.

The adjustment time calculated respectively according to the sampling point set 0, the sampling point set 1, the sampling point set 2, and the sampling point set 3 is different, for example, if the adjustment time calculated according to the sampling point set 0 is 0.5 s, the adjustment time calculated according to the sampling point set 1 is 1 s, the adjustment time calculated according to the sampling point set 2 is 0.4 s, and the adjustment time calculated according to the sampling point set 3 is 0.25 s, and if the energy statistical value of the sampling point set 1 is the largest, the adjustment time calculated according to the sampling point set 1 is closest to the true value and most trustable, and therefore should be taken as the down sampling result.

The third down sampling module 99 performs down sampling on the channel coefficients calculated respectively according to the sampling point set 0, the sampling point set 1, the sampling point set 2, and the sampling point set 3 according to the fed back information of the down sampling position, so as to obtain a down sampling result of channel estimation.

As the channel coefficients calculated respectively according to the sampling point set 0, the sampling point set 1, the sampling point set 2, and the sampling point set 3 are also different, if the energy statistical value of the sampling point set 1 is the largest, the channel coefficient estimated according to the sampling point set 1 is closest to the true value and most trustable, and therefore should be taken as the down sampling result.

To sum up, in the down sampling devices according to the foregoing three embodiments, since the sampling position corresponding to the sampling point set with the largest energy statistical value is selected as the down sampling position by the selection unit, and down sampling is performed according to the down sampling position by the down sampling unit to extract a down sampling point, the energy of the down sampling point extracted in down sampling is as large as possible, as compared with the extraction of the down sampling point at a fixed sampling position of each sample point sequence in the prior art.

In conclusion, the above descriptions are merely specific embodiments of the present invention, and the scope of the present invention is not limited thereto. Changes or replacements readily apparent to persons skilled in the prior art within the technical scope of the present invention should fall within the scope of the present invention. Therefore, the protection scope of the present invention is subject to the appended claims.

What is claimed is:

1. A down sampling method comprising:
    extracting energy statistical values of sampling point sets in a current period;
    selecting a sampling position corresponding to a sampling point set with the largest energy statistical value as a down sampling position; and
    performing down sampling according to the down sampling position,
    wherein extracting the energy statistical values comprises:
        taking statistics of energy values of sampling points in the sampling point sets;
        outputting energy statistical values of the sampling point sets in one burst impulse sequence;
        calculating adjustment factors according to the energy statistical values of the sampling point sets in the one burst impulse sequence;
        multiplying the energy statistical values by the adjustment factors; and
        accumulating the products of the energy statistical values and the adjustment factors in one period to obtain the energy statistical values in the current period.

2. The down sampling method according to claim 1, wherein each of the sampling point sets comprises a set of sampling points corresponding to the same sampling position in each symbol in sampling sequences corresponding to symbols in the current period.

3. The down sampling method according to claim 1, wherein each of the sampling point sets comprises a set of sampling points corresponding to two or more sampling positions in each symbol in sampling sequences corresponding to symbols in the current period, and wherein the two or more sampling positions have a predetermined interval.

4. The down sampling method according to claim 1, wherein the energy statistical values comprise sums of energy of sampling points in the sampling point sets or averages of the energy of the sampling points in the sampling point sets.

5. The down sampling method according to claim 2, wherein the down sampling position further comprises one or more sampling positions having a predetermined interval from the sampling position corresponding to the sampling point set with the largest energy statistical value.

6. The down sampling method according to claim 1, wherein each of the sampling point sets comprises a single sampling point in each sampling sequence corresponding to each symbol in the current period, wherein the energy statistical value comprises an energy value of the single sampling point, wherein the current period comprises at least one symbol, wherein each symbol corresponds to one sampling sequence, wherein energy values of sampling point sets in the sampling sequence are compared, and wherein a sampling position corresponding to a sampling point set with the largest energy value is determined as a down sampling position of the symbol.

7. The down sampling method according to claim 1, wherein performing the down sampling according to the down sampling position comprises performing down sampling on each symbol in a next period according to the selected down sampling position in the current period.

8. The method of claim 1, wherein extracting the energy statistical values comprises using an extraction unit of a down sampling device, wherein selecting the sampling position comprises using a selection unit of the down sampling device, and wherein performing the down sampling comprises using a down sampling unit of the down sampling device.

9. A down sampling device comprising:
    an extraction unit configured to extract energy statistical values of sampling point sets in a current period;
    a selection unit configured to select a sampling position corresponding to a sampling point set with the largest energy statistical value as a down sampling position; and
    a down sampling unit configured to perform down sampling according to the down sampling position,
    wherein the extraction unit comprises sampling point energy statistical devices that are configured to take statistics of energy values of sampling points in the sampling point sets, output energy statistical values of the sampling point sets in one burst impulse sequence, and couple each output respectively to a received signal strength indication statistical device and a multiplier,
    wherein the received signal strength indication statistical devices are configured to calculate adjustment factors according to the energy statistical values of the sampling point sets and output and couple each adjustment factor to one of the multipliers,
    wherein the multipliers are configured to multiply the output of the sampling point energy statistical devices by the corresponding output of the received signal strength indication statistical devices and output and couple each result to an accumulator, and
    wherein the accumulators are configured to accumulate each output of the multipliers in one period to obtain the energy statistical values in the current period.

10. The down sampling device according to claim 9, wherein each of the sampling point sets comprises a set of sampling points corresponding to the same sampling position in each symbol in sampling sequences corresponding to symbols in the current period.

11. The down sampling device according to claim 9, wherein each of the sampling point sets comprises a set of sampling points corresponding to two or more sampling positions in each symbol in sampling sequences corresponding to symbols in the current period, and wherein the two or more sampling positions have a predetermined interval.

12. The down sampling device according to claim 9, wherein the energy statistical values comprise sums of energy of sampling points in the sampling point sets or averages of the energy of the sampling points in the sampling point set.

13. The down sampling device according to claim 10, wherein the down sampling position further comprises one or more sampling positions having a predetermined interval from the sampling position corresponding to the sampling point set with the largest energy statistical value.

14. The down sampling device according to claim 9, wherein each of the sampling point sets comprises a single sampling point in each sampling sequence corresponding to each symbol in the current period, wherein the energy statistical value comprises an energy value of the single sampling point, wherein the current period comprises at least one symbol, wherein each symbol corresponds to one sampling sequence, wherein energy values of sampling point sets in the sampling sequence are compared, and wherein a sampling position corresponding to a sampling point set with the largest energy value is determined to be a down sampling position of the symbol.

15. The down sampling device according to claim 9, wherein the down sampling unit further comprises:
- a storage module configured to store information of the down sampling position determined in the current period; and
- a down sampling module configured to perform down sampling on each symbol in a next period according to the information of the down sampling position.

16. The method of claim 8, wherein the extraction unit comprises sampling point energy statistical devices, received signal strength indication statistical devices, multipliers, and accumulators, wherein taking the statistics of the energy values and calculating the adjustment factors comprise using the sampling point energy statistical devices, wherein calculating the adjustment factors comprises using the received signal strength indication statistical devices, wherein multiplying the energy statistical values comprises using the multipliers, and wherein accumulating the products comprises using the accumulators.

\* \* \* \* \*

UNITED STATES PATENT AND TRADEMARK OFFICE
CERTIFICATE OF CORRECTION

PATENT NO. : 8,483,342 B2
APPLICATION NO. : 13/368801
DATED : July 9, 2013
INVENTOR(S) : Gengshi Wu et al.

It is certified that error appears in the above-identified patent and that said Letters Patent is hereby corrected as shown below:

Title Page, Item (56)

The following reference needs to be added to the References Cited under Foreign Patent Documents:

CN 1862981 A    11-15-2006    Huawei Technologies Co., Ltd.

Signed and Sealed this
Third Day of September, 2013

Teresa Stanek Rea
*Acting Director of the United States Patent and Trademark Office*